United States Patent
Izumi et al.

(10) Patent No.: US 6,720,211 B2
(45) Date of Patent: Apr. 13, 2004

(54) METHOD FOR FABRICATING ELECTRIC INTERCONNECTIONS AND INTERCONNECTION SUBSTRATE HAVING ELECTRIC INTERCONNECTIONS FABRICATED BY THE SAME METHOD

(75) Inventors: Yoshihiro Izumi, Kashihara (JP); Yoshimasa Chikama, Souraku-gun (JP); Hisao Ochi, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/137,217

(22) Filed: May 2, 2002

(65) Prior Publication Data

US 2002/0123176 A1 Sep. 5, 2002

Related U.S. Application Data

(62) Division of application No. 09/573,464, filed on May 17, 2000.

(30) Foreign Application Priority Data

May 18, 1999 (JP) .............................. 11-137122
Mar. 3, 2000 (JP) ........................... 2000-058696

(51) Int. Cl.[7] .............................................. H01L 29/00
(52) U.S. Cl. ..................................................... 438/128
(58) Field of Search ........................... 438/7, 128, 598, 438/618, 500, 501–503, 492, 507–509, 582

(56) References Cited

U.S. PATENT DOCUMENTS

| | | | |
|---|---|---|---|
| 5,340,491 A | 8/1994 | Enomoto et al. | 252/79.1 |
| 5,652,430 A | 7/1997 | Lee | 250/370.09 |
| 5,706,064 A | 1/1998 | Fukunaga et al. | 349/43 |
| 5,835,167 A | 11/1998 | Bongaerts et al. | 349/32 |
| 5,858,462 A | 1/1999 | Yamazaki | 427/226 |
| 5,880,801 A | 3/1999 | Scherer et al. | 349/124 |
| 5,926,735 A | 7/1999 | Yamazaki et al. | 438/635 |
| 5,943,580 A * | 8/1999 | Ramakrishnan | 438/381 |
| 6,075,257 A | 6/2000 | Song | |
| 6,218,206 B1 | 4/2001 | Inoue et al. | 438/30 |

FOREIGN PATENT DOCUMENTS

| | | | |
|---|---|---|---|
| EP | 3642585 A | 2/1972 | C23B/5/60 |
| JP | 62-288883 | 12/1987 | |
| JP | 63-280222 | 11/1988 | G02F/1/133 |
| JP | 1-96383 | 4/1989 | |
| JP | 2-83533 | 3/1990 | |

(List continued on next page.)

OTHER PUBLICATIONS

M. Ikeda, et al. "Low Resistance Copper Address Line for TFT–LCD", Japan Display '89, pp. 498–501.

(List continued on next page.)

*Primary Examiner*—Craig A. Thompson
(74) *Attorney, Agent, or Firm*—Edwards & Angell, LLP; David G. Conlin, Esq.; Richard J. Roos, Esq.

(57) ABSTRACT

An oxide film is formed on an insulating substrate by means of a wet type film forming technique such as a sol-gel method, a chemical deposition method or a liquid phase deposition method. Next, the oxide film is patterned according to the shape of interconnections. Then, a metal film made of Ni is formed on an oxide film pattern by such a wet type film forming technique as a wet type plating method. Further, a metal film made of Au that has a low resistance is laminated on the metal film made of Ni by electroless plating, and a metal film made of Cu that has a low resistance and is low cost is laminated on the Au film by electroplating. Thus, by the above method for manufacturing electric interconnections, a large-area interconnection substrate for a display device and an image detector is able to be fabricated at low cost without using a vacuum film forming apparatus.

21 Claims, 9 Drawing Sheets

FOREIGN PATENT DOCUMENTS

| JP | 2-223924 | 9/1990 | |
| --- | --- | --- | --- |
| JP | 403018826 A | 1/1991 | |
| JP | 4-232922 | 8/1992 | |
| JP | 6-342098 | 12/1994 | |
| JP | A-8-144061 | 6/1996 | |
| JP | 8-242001 | 9/1996 | ......... H01L/29/786 |
| JP | 8-253318 | 10/1996 | |
| JP | 9-278437 | 10/1997 | |
| JP | A-10-020487 | 1/1998 | ........... G03F/7/004 |
| JP | 10237078 A | 9/1998 | |
| JP | 10-255556 | 9/1998 | |

OTHER PUBLICATIONS

"Technology of Sol–Gel Method", published by Agune Shoufusha: Author: Sumio Sakka. In Japanese with Partial English Translation.

T. Furusaki, et al. "Preparation of ITO Thin Films by Sol–Gel Method", Journal of the Ceramic Society of Japan, vol. 102, No. 2, 1994, pp. 200–205. In Japanese with Abstract and partial translations.

Masanobu Izaki, et al. "Transparent Zinc Oxide Films Chemically Prepared from Aqueous Solution", J. Electrochem. Soc. vol. 144, No. 1, Jan. 1997.

Masanobu Izaki, "Preparation for Transparent Indium Oxide Film from a Chemically Deposited Precursor", Electrochemical and Solid–State Letters, vol. 1, No. 5, 1998.

L. S. Jeromin, et al. "Application of a–Si Active–Matrix Technology in X–Ray Detector Panel", SID 97, DIGEST, 1997, pp. 91–94.

Office Action dated Dec. 20, 2002, issued in connection with corresponding Korean Patent Application No. 10–2000–0026403.

Office Action dated Mar. 28, 2002, issued in connection with corresponding Korean Patent Application No. 10–2000–0026403.

Cai, et al., "Reversible transition between transparency and opacity for the porous silica host dispersed with silver nanometer particles within its pores", Applied Physics Letters, vol. 69, issue 20, pp. 2980–2982 (Nov. 11, 1996).

Office Action dated Jun. 10, 2003, issued in connection with corresponding Japanese Patent Application No. 2000–058696.

\* cited by examiner

METHOD FOR FABRICATING ELECTRIC INTERCONNECTIONS AND INTERCONNECTION SUBSTRATE HAVING ELECTRIC INTERCONNECTIONS FABRICATED BY THE SAME METHOD

CROSS REFERENCE TO RELATED APPLICATIONS

This application claims priority from, and is a divisional of U.S. patent application Ser. No. 09/573,464, which was filed on May 17, 2000, is currently pending, and which claimed priority from Japanese Patent Application No. 11-137122, which was filed on May 18, 1999, and Japanese Patent Application No. 200-058696, which was filed on Mar. 3, 2000.

BACKGROUND OF THE INVENTION

The present invention relates to a method for fabricating electric interconnections to be used for electronic circuit boards of electric equipment such as a flat panel display or a two-dimensional image detector, further relates to an interconnection substrate applicable to a variety of electronic devices, relates to display devices such as a liquid crystal display (LCD), a plasma display (PDP), an electrochromic display (ECD), an electroluminescent display (ELD) and relates to an image detector using light or radial rays.

Conventionally, in a flat panel display represented by the liquid crystal display, display material such as liquid crystal or electric discharge gas is normally held between a pair of substrates, and a voltage is applied to this display material. In this stage, electric interconnections made of conductive material are provided at least on one substrate.

For example, in the case of an active matrix drive type display, gate electrodes and data electrodes are arranged in a matrix form on one substrate (active matrix substrate) of a pair of substrates that hold the display material between them, and a thin film transistor (TFT) and a pixel electrode are arranged at each intersection. These gate electrodes and data electrodes are normally made of a metal material such as Ta, Al or Mo and formed into a film by a dry film forming method such as a sputtering method.

There has also been developed a flat panel type two-dimensional image detector obtained by combining an active matrix substrate having a construction similar to that of the aforementioned active matrix drive type display with a photodetector element or an X-ray detecting element. The details of the two-dimensional image detector are disclosed in the reference documents of "L. S Jeromin, et al., "Application of a-Si Active-Matrix Technology in X-Ray Detector Panel", SID 97 DIGEST, p.91–94, 1997", "Japanese Patent Laid-Open Publication No. HEI 6-342098" and others.

If it is tried to increase the area and improve the definition of the flat panel display or the two-dimensional image detector of the above kind, then the resistance and parasitic capacitance of the electric interconnections increase as the drive frequency increases, and accordingly, the delay of the drive signal emerges as a serious problem.

Therefore, in order to solve the problem of this drive signal delay, it is tried to use low electric resistance Cu (bulk resistivity is 1.7 $\mu\Omega\cdot cm$) as an interconnection material instead of the conventional interconnection materials of Al (bulk resistivity is 2.7 $\mu\Omega\cdot cm$), $\alpha$-Ta (bulk resistivity is 13.1 $\mu\Omega\cdot cm$) and Mo (bulk resistivity is 5.8 $\mu\Omega\cdot cm$). There is a disclosure of the examination of a TFT liquid crystal display (TFT-LCD) employing Cu as a gate electrode material in, for example, the reference of "Low Resistance Copper Address Line for TFT-LCD" (Japan Display '89 p.498–501). This reference document states clearly the necessity for improving the adhesion by interposing a metal film of Ta or the like on the groundwork since the Cu film formed by the sputtering method has poor adhesion to the groundwork glass substrate.

However, in the case of the interconnection structure in which a metal film of Ta or the like is provided as an interposition on the above-mentioned groundwork, the Cu film and the groundwork metal film of Ta or the like need individual dry film forming processes and etching processes, and this disadvantageously causes an increased number of processes and cost increase.

In view of the above, the prior art reference of Japanese Patent Laid-Open Publication No. HEI 4-232922 proposes electric interconnection fabricating method for using a transparent electrode made of indium-tin-oxide (ITO: tin-added indium oxide) or the like as a groundwork film and forming by a technique of plating the surface of the groundwork film with a metal film of Cu or the like. According to this technique, there is clearly stated the effect of allowing Cu interconnections to be efficiently formed even in a large area since the plating metal can be formed as a film selectively on the ITO film and therefore the patterning process is necessary for only the ITO film of the transparent electrode. There is also stated a structure for interposing a metal film of Ni or the like having a good adhesion property between ITO and Cu.

There has also been proposed electric interconnection fabricating method for forming a metal film of Ni, Au, Cu or the like on a patterned ITO film by a plating technique for the various purposes of reducing the processes of the active matrix substrate, reducing the resistance of the transparent electrode of a simple matrix type liquid crystal display device, increasing the solder wettability on the ITO film and so on besides the electric interconnection fabricating method described in the aforementioned prior art reference of Japanese Patent Laid-Open Publication No. HEI 4-232922 (refer to, for example, the prior art reference documents of Japanese Patent Laid-Open Publication No. HEI 2-83533, Japanese Patent Laid-Open Publication No. HEI 2-223924, Japanese Patent Laid-Open Publication No. SHO 62-288883 and Japanese Patent Laid-Open Publication No. HEI 1-96383).

However, in the case of the electric interconnection fabricating method using ITO for the groundwork, the metal film is formed by the plating technique using no vacuum film forming apparatus. However, the ITO film that becomes the groundwork of the metal film is formed still by a vacuum film forming apparatus of the sputtering method or the vacuum deposition method. This leads to the problem that a sufficient cost reduction effect cannot be obtained and the method cannot easily cope with a large-area substrate.

SUMMARY OF THE INVENTION

Accordingly, an object of the present invention is to provide an electric interconnection fabricating method, an interconnection substrate, a display device and an image detector, which is able to be fabricated at low cost and to easily cope with a large-area substrate using no vacuum film forming apparatus.

In order to achieve the aforementioned object, the present invention provides an electric interconnection fabricating method comprising: an oxide film forming process for forming an oxide film on an insulating substrate by a first wet type film forming technique; and a metal film forming process for forming a metal film on the oxide film by a second wet type film forming technique.

According to the above invention, the electric interconnections having the laminate structure formed of the metal film and the oxide film can be obtained using no vacuum film forming apparatus, and the sufficient cost reduction effect can be obtained by comparison with the conventional electric interconnection fabricating method. The first and second wet type film forming techniques can easily cope with the large-area substrate since the first and second wet type film forming techniques can more easily form a large-area film than the vacuum film forming technique. The electric interconnections having a laminate structure formed of the metal film and the oxide film can be obtained without using any vacuum film forming apparatus. Therefore, electric interconnections can be easily formed on an insulating substrate (a polymer film, for example) or the like made of an organic material besides a glass substrate having excellent vacuum resistance and heat resistance. Furthermore, electric interconnections can be formed with high productivity according to a roll-to-roll system using a long film base material.

In one embodiment of the present invention, the electric interconnection fabricating method further comprises a patterning process for patterning the oxide film according to a specified shape between the oxide film forming process and the metal film forming process.

According to the above embodiment, the metal film formed through the metal film forming process can be selectively formed only on the oxide film patterned according to a specified shape through the patterning process. Therefore, the metal film is formed only in the required portion by comparison with the case where an oxide film and a metal film are formed on the entire surface of an insulating substrate and thereafter both the films are patterned. Accordingly, the patterning of the metal film becomes unnecessary, and also no waste of the metal film material is generated.

In one embodiment of the present invention, a precursor of the oxide film has photosensitivity and the patterning process for patterning the oxide film according to the specified shape comprises a process for applying light to the precursor of the oxide film.

According to the above embodiment, neither resist coating process nor resist removing process is required between the oxide film formation and the patterning process, and therefore, the producibility can be improved.

In one embodiment of the present invention, the first wet type film forming technique used for the oxide film forming process is a sol-gel method.

The above-mentioned sol-gel method is a sort of wet type film forming technique and includes the processes of using a metal organic compound or an inorganic compound as a solution, promoting the hydrolysis and polycondensation of a compound in the solution so as to fix a sol as a gel and forming an oxide solid through the heating of the gel. According to the above embodiment, the oxide film can be easily formed by merely coating a sol-gel solution on the insulating substrate of glass or the like and sintering the same by the sol-gel method using no vacuum film forming apparatus. Furthermore, according to the sol-gel method, there can be formed a multi-porous oxide film in which minute holes exist in a network style as compared with the smooth surface of the oxide film formed by the vacuum film forming apparatus. Therefore, if the oxide film obtained by the sol-gel method is plated with a metal film, then the minute holes of the oxide film produce an anchor effect, allowing a plating film of a very good adhesion property to be obtained. This also allows electroless Cu plating to be effected on an ITO film, which has conventionally been difficult.

In one embodiment of the present invention, the first wet type film forming technique used for the oxide film forming process is either a chemical deposition method or a liquid phase deposition method.

The chemical deposition method is the method of immersing an insulating substrate in an aqueous solution and depositing an oxide film on the insulating substrate through a redox reaction in the aqueous solution. The liquid phase deposition method (LPD method) is the method of depositing an oxide film on an insulating substrate through a hydrolytic equilibrium reaction of a metallic fluoro-complex or hydrosilicofluoric acid. According to the embodiment, an oxide film can be easily formed by merely immersing an insulating substrate in an aqueous solution by the chemical deposition method or the liquid phase deposition method using no vacuum film forming apparatus. According to the oxide film obtained by the chemical deposition method, crystal grains grow around a core of a metal catalyst made to adhere to the surface of the insulating substrate. Therefore, the surface becomes more undulated than that of the oxide film formed by the vacuum film forming apparatus. Therefore, if the oxide film obtained by the chemical deposition method is plated with a metal film, then the surface unevenness of the oxide film produces an anchor effect, allowing a plating film of a very good adhesion property to be obtained.

In one embodiment of the present invention, the second wet type film forming technique used for the metal film forming process is a wet type plating method.

According to the above embodiment, in the case of the electroplating of the wet type plating technique that is classified roughly into electroplating and electroless plating, a metal film is deposited on the surface of the cathode by arranging a metal that serves as an anode and the cathode (electrode subjected to plating) in a plating liquid in which metal ions are dissolved and flowing a direct current through the plating liquid. Therefore, if the oxide film of the groundwork formed through the oxide film forming process has conductivity, then it is allowed to deposit a metal film on only the oxide film by making the oxide film serve as a cathode. In the case of the electroless plating (reduction plating or displacement plating), a metal film can be deposited flowing no current through the plating liquid. Therefore, a metal film can be deposited regardless of the presence or absence of the conductivity of the oxide film of the groundwork formed through the oxide film forming process. A plating film having a great film thickness can be formed even in a large area since a current distribution density influences less than in the case of electroplating. Furthermore, by performing the process for making the catalyst adhere selectively to only the surface of the oxide film in this stage, a metal film can also be deposited selectively on only the oxide film. Thus, by using the wet type plating method for the wet type film forming technique of the metal film forming process, a metal film can be easily formed using no vacuum film forming apparatus.

In one embodiment of the present invention, the oxide film has a plating catalyst.

According to the above embodiment, the process of providing the plating catalyst can be eliminated when forming a metal film on the oxide film by electroless plating in a subsequent process.

In one embodiment of the present invention, the oxide film is a conductive oxide film.

According to the above embodiment, a metal film can be formed on the conductive oxide film by electroplating by providing the oxide film by a conductive oxide film.

In one embodiment of the present invention, the conductive oxide film has transparency.

According to the above embodiment, by providing the oxide film by a conductive oxide film having transparency, the transparent electrode provided for each pixel of, for example, a liquid crystal display device or a two-dimensional image detector besides the electric interconnections can be formed of the same transparent conductive oxide film, allowing the reduction in number of processes to be achieved.

In one embodiment of the present invention, the conductive oxide film is a film to be used for the electric interconnections and an application other than the electric interconnections and is formed of an identical material on the insulating substrate through an identical process.

According to the above embodiment, if it is required to form a film of a transparent conductive film (for example, a transparent electrode provided for each pixel) other than the use of electric interconnections as in the liquid crystal display device or a two-dimensional image detector, then a transparent conductive oxide film formed of an identical material through an identical process can be used for the electric interconnections and as a film for the use other than the electric interconnection use. This allows the reduction in number of processes and efficient fabrication of electric interconnections.

In one embodiment of the present invention, the metal film is either a single layer film made of any one of nickel (Ni), copper (Cu) and gold (Au) or a multi-layer film including at least one layer of a single layer film made of any one of nickel (Ni), copper (Cu) and gold (Au).

According to the above embodiment, the Ni film can be formed on the oxide film (ITO film etc.) with a good adhesion property, and electroless plating can be performed selectively on only the oxide film (ITO film etc.). Further, Cu and Au have a low specific resistance, and this can achieve electric interconnections having a low resistance. In particular, by forming an Ni film on the oxide film (ITO film) and further forming a Cu, Au or Cu/Au film on the Ni film, then electric interconnections having a low resistance and a good adhesion property can be provided.

In one embodiment of the present invention, an interconnection substrate comprises electric interconnections of a laminate structure including an oxide film formed on an insulating substrate by a first wet type film forming technique and a metal film formed on the oxide film by a second wet type film forming technique.

According to the interconnection substrate of one inventive aspect, electric interconnections having a laminate structure formed of a metal film and an oxide film can be obtained without using any vacuum film forming apparatus, allowing a sufficient cost reduction effect to be obtained as compared with the case where electric interconnections formed by the conventional fabricating method is used. The first and second wet type film forming techniques can easily cope with a large-area substrate since the film formation in a large area can be easily achieved by comparison with the vacuum film forming technique. Furthermore, electric interconnections having the laminate structure formed of the metal film and the oxide film can be obtained without using any vacuum film forming apparatus. Therefore, electric interconnections can be easily formed on an insulating substrate (for example, a polymer film) or the like made of an organic material besides the glass substrate having excellent vacuum resistance and heat resistance. Furthermore, electric interconnections can be formed with good productivity according to a roll-to-roll system using a very long film material taking advantage of the merit that no vacuum system is used.

In one embodiment of the present invention, the oxide film is patterned according to a shape of interconnections and the metal film is formed selectively on the patterned oxide film.

According to the above embodiment, the metal film is formed only in the necessary portion by comparison with the case where the oxide film and the metal film are both formed on the entire surface of the insulating substrate and thereafter patterned according to the shape of interconnections. Therefore, the metal film patterning process becomes unnecessary, and also no waste of the metal film material is generated.

In one embodiment of the present invention, the precursor of the oxide film has photosensitivity.

According to the above embodiment, the oxide film can be patterned according to the specified shape by applying light to the precursor of the oxide film, and neither resist coating process nor resist removing process is needed between oxide film formation and the patterning, and therefore, the producibility can be improved.

In one embodiment of the present invention, the oxide film is a multi-porous film.

According to the above embodiment, if the surface of the multi-porous oxide film is plated with a metal film, then the minute holes of the oxide film produce an anchor effect, allowing a plating film of a very good adhesion property to be obtained. This allows electroless Cu plating to be effected on an ITO film, which has conventionally been difficult.

In one embodiment of the present invention, the oxide film is a film having surface unevenness.

According to the above embodiment, the surface unevenness of the oxide film produces an anchor effect, allowing a plating film of a very good adhesion property to be formed on the oxide film.

In one embodiment of the present invention, the oxide film is a conductive oxide film.

According to the above embodiment, a metal film can be formed on the conductive oxide film by electroplating by providing the oxide film by the conductive oxide film.

In one embodiment of the present invention, the conductive oxide film has transparency.

According to the above embodiment, by providing the oxide film by a conductive oxide film having transparency, the transparent electrode provided for each pixel of, for example, a liquid crystal display device or a two-dimensional image detector besides the electric interconnections can be formed of the same transparent conductive oxide film, allowing the reduction in number of processes to be achieved.

In one embodiment of the present invention, the metal film is either a single layer film made of any one of nickel (Ni), copper (Cu) and gold (Au) or a multi-layer film including at least one layer of a single layer film made of any one of nickel (Ni), copper (Cu) and gold (Au).

According to the above embodiment, the Ni film can be formed on the oxide film (ITO film etc.) with a good adhesion property, and electroless plating can be performed selectively on only the oxide film (ITO film etc.). Further, Cu and Au have a low specific resistance, and this can achieve electric interconnections having a low resistance. In particular, by forming an Ni film on the oxide film (ITO film) and further forming a Cu, Au or Cu/Au film on the Ni film, then electric interconnections having a low resistance and a good adhesion property can be provided.

In one embodiment of the present invention, a display device comprises the above interconnection substrates.

According to the above embodiment, a display device that can be fabricated at low cost without using a vacuum film forming apparatus and is able to cope with a large-area substrate can be provided.

In one embodiment of the present invention, an image detector comprises the above interconnection substrates.

According to the above embodiment, an image detector that can be fabricated at low cost without using a vacuum film forming apparatus and is able to cope with a large-area substrate can be provided.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
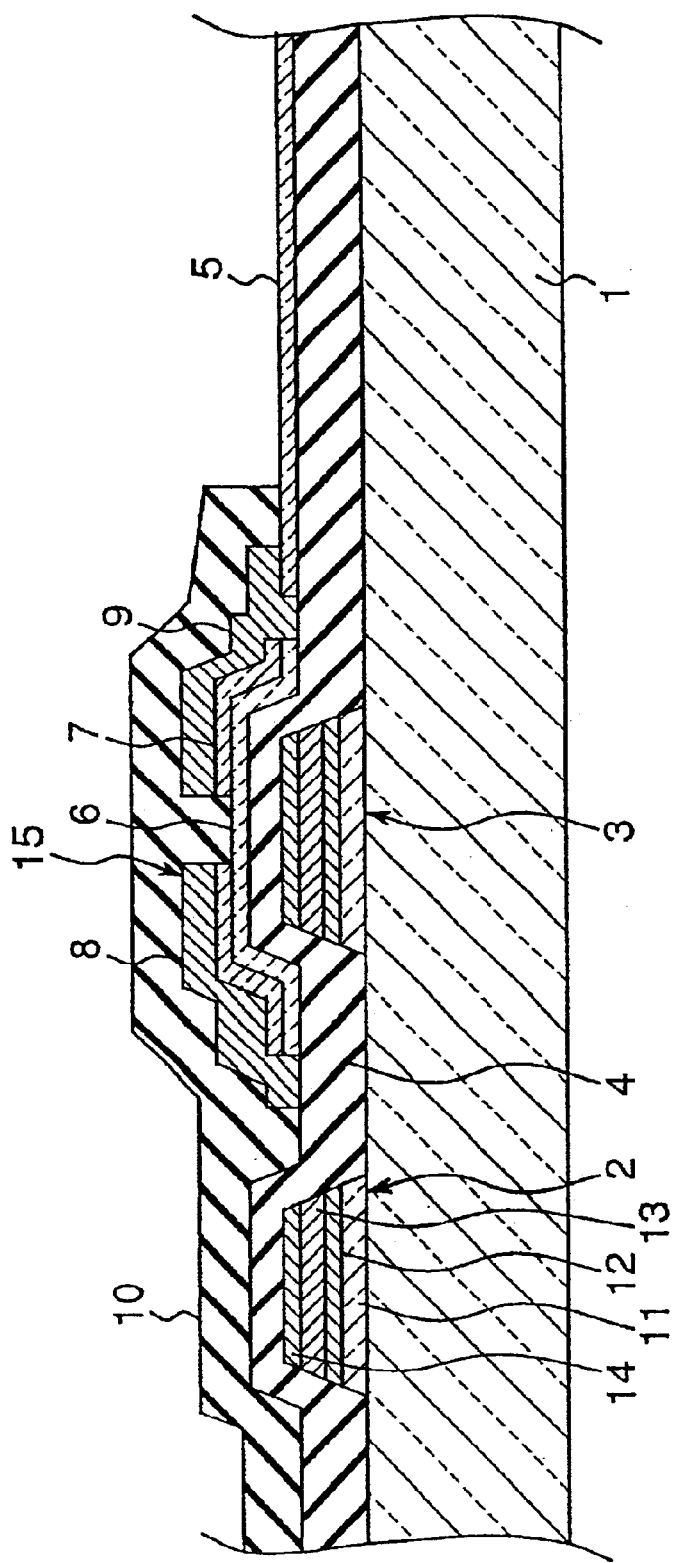
FIG. 1 is a sectional view of an interconnection substrate to be used for a display device according to a first embodiment of the present invention.

An electric interconnection fabricating method of the present invention, and a interconnection substrate, a display device and an image detector using the above method will be described in detail below on the basis of embodiments shown in the drawings.

First Embodiment

FIG. 1 is a sectional view of an interconnection substrate to be used for the display device of the first embodiment of the present invention.

As shown in FIG. 1, a gate interconnection 2 and a gate electrode 3 are formed on a glass substrate 1 that serves as an insulating substrate. The gate interconnection 2 and the gate electrode 3 are constructed of a laminate film formed entirely by a wet type film forming technique according to an electric interconnection fabricating method described later, dissimilar to conventional electric interconnections of Al, Ta and Mo formed by the sputtering method. A gate insulating film 4 made of SiNx is further formed on the laminate film. A TFT portion 15 is formed on the gate electrode 3. The TFT portion 15 is constructed of a channel layer 6 made of a-Si:H, a contact layer 7 made of $n^+$-type a-Si:H, a source electrode 8 made of Al (or Ta, Mo or the like) and a drain electrode 9. Further, a transparent electrode 5 (or a reflecting electrode) is formed in the pixel portion. An insulating overcoat 10 made of SiNx and an organic insulating film are further formed on the TFT portion 15 and a bus line portion (the gate interconnection 2 and a source interconnection (not shown)). An interconnection substrate provided with the aforementioned active element of TFT or the like is generally referred to as an active matrix substrate.

Figure 2:
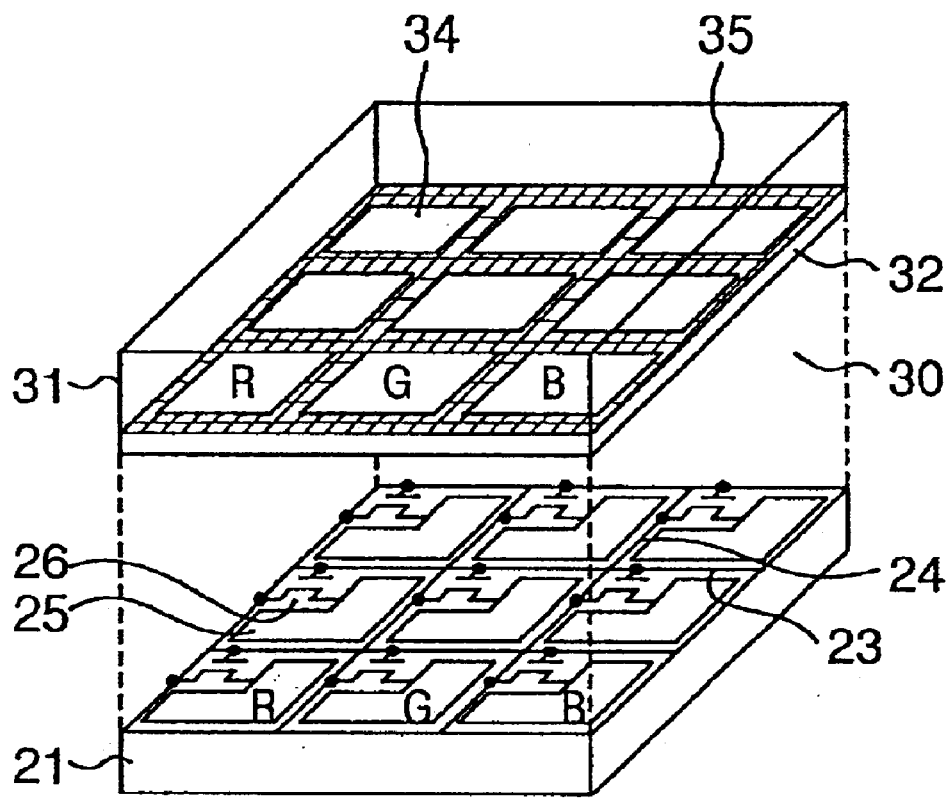
FIG. 2 is a perspective view showing the structure of an active matrix type liquid crystal display device having the above interconnection substrate.

FIG. 2 is a perspective view showing a structure of an active matrix type liquid crystal display device employing the above active matrix substrate. As shown in FIG. 2, gate electrodes 23 and source electrodes 24 are arranged in a matrix form on an insulating substrate (an active matrix substrate) 21. A pixel electrode 25 and a TFT 26 are provided at every intersection of the gate electrodes 23 and the source electrodes 24. Color filters 34, a black matrix 35 and common electrodes 32 are provided on a substrate 31 opposite to the active matrix substrate 21. The active matrix type liquid crystal display device has a structure in which liquid crystal 30 is interposed between the active matrix substrate 21 and the opposite substrate 31. In this active matrix type liquid crystal display device, a transparent type liquid crystal display device can be provided if a transparent electrode is employed as the pixel electrode 25, or a reflecting type liquid crystal display device can be provided if a reflecting electrode is employed as the pixel electrode 25.

A method for fabricating the gate interconnection 2 and the gate electrode 3 shown in FIG. 1 will be described next. FIGS. 3A through 3E are process charts showing the method for fabricating the gate interconnection 2 and the gate electrode 3. It is to be noted that only a laminate film constructed of an ITO film 11, an Ni film 12, an Au film 13 and a Cu film 14 is shown in connection with the gate interconnection 2 and the gate electrode 3 of FIG. 1.

First Process

Figure 3A:
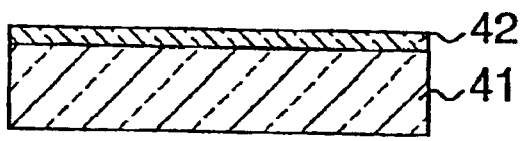
FIGS. 3A through 3E are views showing a method for fabricating the electric interconnections shown in FIG. 1.

First, in a first process that serves as an oxide film forming process, an oxide thin film 42 is formed on the surface of an insulating substrate 41 made of glass or the like by a wet type film forming technique, as shown in FIG. 3A. The insulating substrate of the present invention includes an inorganic substrate of glass, ceramic or a semiconductor substrate (or a conductor substrate) having a surface provided with an insulating layer and a variety of organic substrates or films of polyethylene terephtalate (PET), acrylonitrile butadiene styrene copolymer (ABS) or polycarbonate (PC).

The wet type film forming technique of this first process is not the dry type film forming technique like the sputtering method or the CVD method but generally means the film forming techniques to be put into practice using no vacuum system. The above method includes, for example, the sol-gel method, the chemical deposition method or the liquid phase deposition method with an aqueous solution, the coating film formation with a solution or resin in which minute particles of oxide are dispersed, a chemical mist deposition (CMD) method with solution mist and spraying method.

The sol-gel method is to use an organic compound or an inorganic compound of a metal in a solution, promote the hydrolysis and polycondensation of the compound in the solution so as to fix the sol as gel and form an oxide solid by heating the gel.

Figure 4:
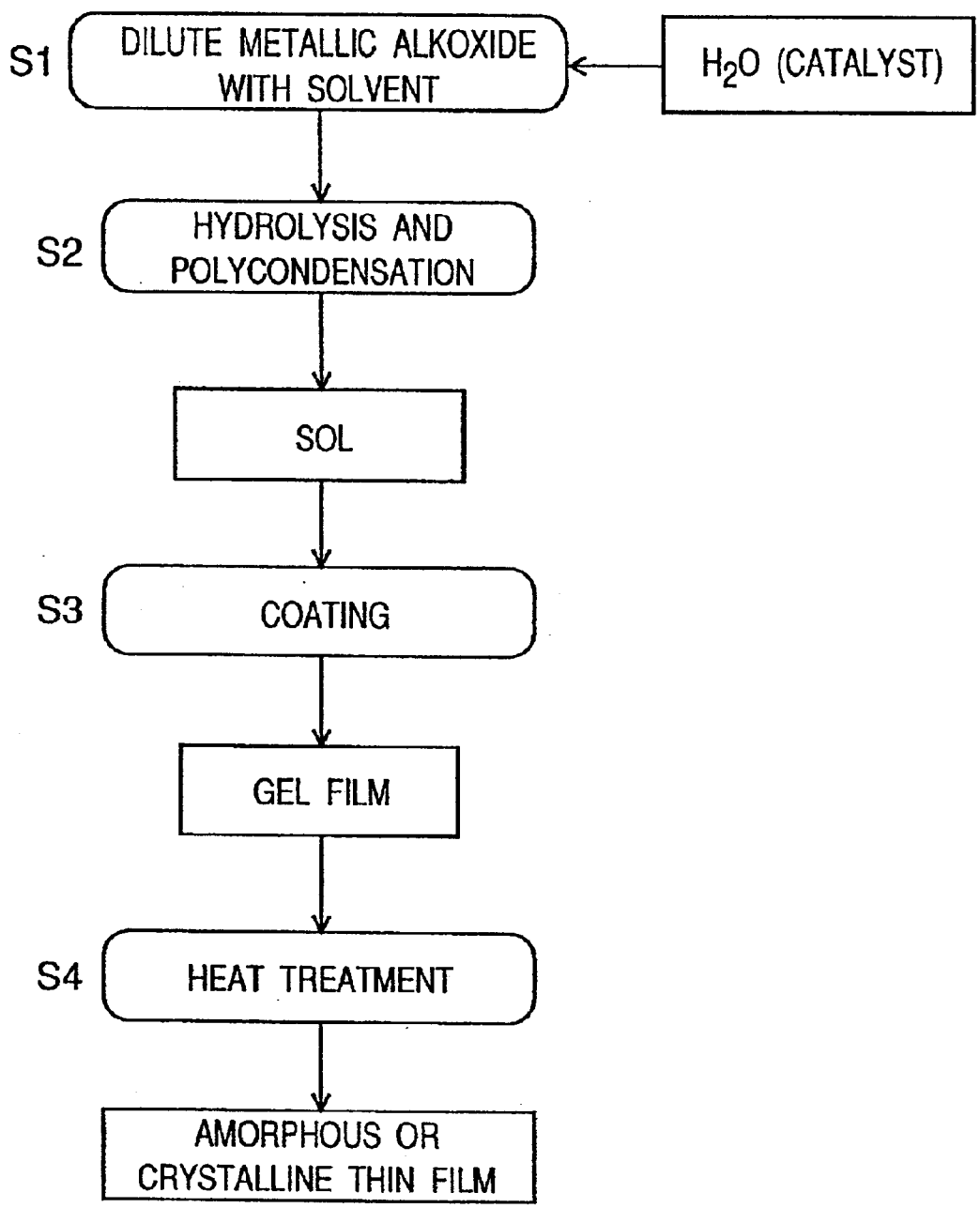
FIG. 4 is a chart showing a procedure for forming a thin film made from a material of metallic alkoxide by the sol-gel method.

FIG. 4 shows a procedure for forming a thin film made from metallic alkoxide by the sol-gel method. The metallic alkoxide capable of causing a polycondensation reaction is appropriate for the parent material. However, a metal salt, a metallic acetylacetonate complex or the like can be used together with the metallic alkoxide. A variety of alcohols are generally used as a solvent.

First, the metallic alkoxide is diluted with a solvent in Step S1.

Next, sol is formed by adding water to cause the hydrolysis and polycondensation reactions in Step S2.

Then, the sol is coated on the insulating substrate in Step S3, generating a gel film. In this case, there can be used a dipping method, a spin coating method and a meniscus coating method as the coating method.

Subsequently, the gel film is dried and thereafter subjected to heat treatment at a temperature of above 400° C. in order to remove the remaining organic matter in Step S4, forming an amorphous or crystalline thin film.

Normally, the gel film obtained through the drying becomes a multi-porous body (xerogel) and tends to become a film in which minute holes are existing in a network shape. By controlling the composition of the sol-gel solution and the sintering condition, the film can be formed into an arbitrary form ranging from the multi-porous film in which minute holes are existing in a network shape to a fine film having a small number of holes.

If this kind of sol-gel method is used, then an oxide film can be formed merely by coating the sol-gel solution on the insulating substrate of glass or the like and sintering the same. This allows the film formation to be achieved using no vacuum film forming apparatus, allows an interconnection substrate to be fabricated at low cost by forming a metal film on the oxide film and allows the method to cope with the formation of a large-area film.

The details of the sorts of the oxide film capable of forming a film by the sol-gel method and the theory thereof are described in the document of "Technology of Sol-Gel Method" (published by Agune Shoufusha, author: Sumio Sakka") and other documents. The film formation of an ITO film, or the transparent conductive oxide film is described by way of examples in the document of "Preparation of ITO Thin Films by Sol-Gel Method" (Journal of the Ceramic Society of Japan, vol.102, NO.2, p.200–205, 1994) and the prior art reference of "Japanese Patent Laid-Open Publication No. HEI 8-253318".

The chemical deposition method is to immerse an insulating substrate in an aqueous solution and deposit an oxide film on the insulating substrate through a redox reaction in the aqueous solution and includes an anodic deposition method and a cathodic deposition method. By using an oxidant and a reductant according to this chemical deposition method, an oxide film can be deposited on the insulating substrate in an electroless manner. For example, if an insulating substrate to which a catalyst adheres is immersed in an aqueous solution in which a metallic nitrate and a reductant (for example, dimethylamine borane (DMAB)) coexist, then a nitric-acid-to-nitrous-acid reduction reaction is caused by electrons supplied from the reductant, as a consequence of which a metal oxide film (or a hydroxide film) is deposited.

As a method for forming an oxide film in an aqueous solution, there is a liquid phase deposition method (LPD method). This liquid phase deposition method is a method for depositing an oxide film on an insulating substrate through the hydrolytic equilibrium reaction of a metallic fluoro-complex or hydrosilicofluoric acid.

By using the chemical deposition method described above, an oxide film can be formed by merely immersing a glass substrate in an aqueous solution. This allows the oxide film formation to be performed using no vacuum film forming apparatus, allows an interconnection substrate to be fabricated at low cost by forming a metal film on the oxide film in a subsequent process and allows the method to cope with the formation of a large-area film.

The formation of a ZnO film, or the transparent conductive oxide film is described in the document of "Transparent Zinc Oxide Films Chemically Prepared from Aqueous Solution" (J. Electrochem. Soc., Vol.144, No.1, January 1997) and the prior art reference of "Japanese Patent Laid-Open Publication No. HEI 9-278437". The formation of an $In_2O_3$ film, or the transparent conductive oxide film is described by way of examples in the document of "Preparation of Transparent Indium Oxide Films from a Chemically Deposited Precursor" (Electrochemical and Solid-State Letters, vol.1, No.5, 1998) and other documents.

The film coating of a solution or resin in which oxide minute particles are dispersed is the method of dispersing ultrafine particles (particles having a primary particle diameter of about 0.01 to 0.1 $\mu$m) of a transparent conductive oxide in a binder of a photosensitive resist or the like and forming a film on a substrate by the spin-coating method or the like. According to the present method, a volumetric change such as the contraction of a binder (i.e., resist resin) is caused by sintering the coated film at a temperature such that the binder is not thermally decomposed. As a result, the dispersed ultrafine particles cohere to come in contact with one another, effecting the performance of the transparent conductive oxide film.

The coating film formation of the solution or resin in which the aforementioned oxide ultrafine particles are dispersed is described in the prior art reference of "Japanese Patent Laid-Open Publication No. HEI 10-255556". The film to be formed by the present method is not a pure oxide film but a film of a mixture of the binder and the oxide ultrafine particles, which is assumed to belong to the definition of the oxide film of the present specification in the broad sense.

Second Process

Figure 3B:
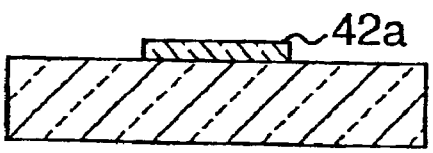

Next, in a second process that serves as a patterning process, there is performed patterning of the oxide thin film 42 (shown in FIG. 3A) obtained through the first process according to an interconnection shape, as shown in FIG. 3B.

The above patterning method is generally put into practice by forming a resist according to a specified pattern on the oxide film by the photolithographic technique or the like and removing the unnecessary oxide film by wet etching or dry etching. For example, HBr or a ferric chloride aqueous solution can be used for the etching of the ITO film. A zinc catalyst and hydrochloric acid can be used for the etching of $SnO_2$.

When otherwise forming an oxide film by the sol-gel method in the first process, it is also acceptable to make the oxide film itself have photosensitivity and perform patterning using no resist. For example, if a gel film is formed by using metallic alkoxide chemically decorated with a chelating agent of acetylacetone (AcAc), benzoylacetone (BzAc) or the like, then the solubility of the gel film is largely changed by ultraviolet ray application. That is, the chelate bond of the gel film to which the ultraviolet rays are applied becomes cut and insoluble in an alkaline solution or alcohol. By performing exposure and development of the gel film and thereafter sintering the resulting object according to this theory, the patterning of the oxide film becomes simplified. It is also acceptable to perform the patterning through the decomposition of the gel film by applying excimer laser light to the normal gel film that has not been chemically decorated.

According to another method, it is enabled to give photosensitivity to the sol-gel solution by blending the sol-gel solution with a resin having photosensitivity at an appropriate rate. If ultraviolet rays are applied to the precursor film of the material obtained by blending a monomer (for example, acrylic monomer) having photopolymerizability to the sol-gel solution with a polymerization initiator, then the monomer is polymerized to form a polymer in a network shape (polymer network), and the sol-gel solution exists in the spaces of the polymer network. Subsequently, by performing a developing process, only the film in the polymer portion to which the ultraviolet rays are applied is left as a negative pattern, and the sol-gel solution is also dissolved in the developing solution together with the monomer that has not been polymerized in the portion to which the ultraviolet rays have not been applied. Finally, by performing sintering at a temperature of about 500° C. so as to remove the remaining organic matter in the polymer network and the sol-gel solution, a sol-gel oxide film pattern is completed. In this case, a negative type photoresist or the like on the market can he used as this photosensitive resin.

Third Process

Figure 3C:
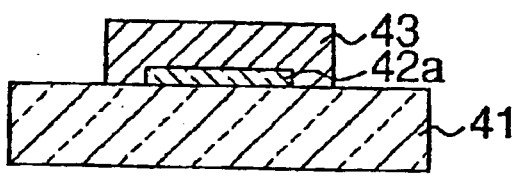
Figure 3D:
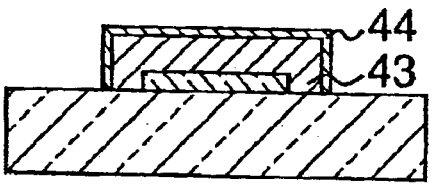

Next, in a third process that serves as a metal film forming process, a metal film 43 made of Ni is formed on an oxide film pattern 42a (shown in FIG. 3B) obtained through the second process by a wet type film forming technique, as shown in. FIG. 3C. The wet type film forming technique in this third process is not the dry type film forming technique like the sputtering method or the CVD method but generally means the film forming technique to be put into practice using no vacuum system, i.e., the so-called wet type plating method.

The wet type plating method is classified roughly into electroplating and electroless plating.

In the case of the electroplating, a metal film is deposited on the cathode surface by arranging a metal that serves as an anode and a cathode (electrode to be plated) in a plating liquid in which metal ions are dissolved and flowing a direct current through the plating liquid. Therefore, if the oxide film formed in the first process has conductivity, then a metal film can be deposited on only the oxide film by using the oxide film as the cathode.

In the case of electroless plating (reduction plating, displacement plating or the like), a metal film can be deposited flowing no current through the plating liquid. Therefore, a metal film can be deposited regardless of the conductivity of the oxide film formed through the first process. Further, by performing the treatment of making the catalyst adhere to the surface of only the oxide film or preparatorily making the oxide film contain a plating catalyst of Pd or the like in this stage, a metal film can also be selectively deposited on only the oxide film.

Figure 3E:
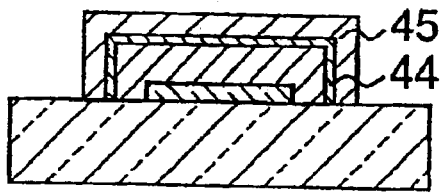

A metal that can be plated by the wet type plating method can be provided by nickel, cobalt, tin, gold, copper, silver or palladium. The metal film to be formed through this third process may be a single layer or a laminate film of metal films having different roles. For example, it is acceptable to laminate a metal film 44 made of Au having a low resistance by electroless plating on the metal film 43 made of Ni exhibiting a good adhesion to the oxide film (FIG. 3D) and further laminate by electroplating a metal film 45 made of Cu that has a low resistance and costs less on the Au film 44 (FIG. 3E).

As described above, through the first process, the second process and the third process, electric interconnections of a laminate structure formed of a metal film and an oxide film can be obtained without using any vacuum film forming apparatus.

In the case where a metal film is formed on an ITO pattern, the metal film has conventionally been formed by the plating technique using no vacuum film forming apparatus. However, with regard to the ITO film that becomes the groundwork of the metal film, the film formation has still been performed by a vacuum film forming apparatus according to the sputtering method or the deposition method. Therefore, the merits of the cost reduction effect and the easiness of the formation of a large-area film have not been sufficiently obtained.

In contrast to this, according to the aforementioned electric interconnection fabricating method, which uses no vacuum film forming apparatus, leads to a low apparatus cost, allowing a sufficient cost reduction effect to be obtained as compared with the conventional electric interconnection fabricating method. Furthermore, the wet type film forming technique, which can easily form a large-area film by comparison with the vacuum film forming technique, can easily cope with a large-area substrate. Furthermore, film formation at low temperature can be achieved, and this allows the reduction in quantity of energy consumption relevant to the film formation.

In regard to the aforementioned first process through the third process, specific four interconnection substrate fabricating methods (1) through (4) will be described below.

Electric Interconnection Fabricating Method (1)

First, as a first process, an ITO film is formed by the sol-gel method on a glass substrate of #1737 produced by Corning Corp. In this stage, a sol-gel solution is diluted with alcohol to an appropriate viscosity and coated to a thickness of about 0.2 $\mu$m by the spin-coating method. Then, by performing drying at a temperature of 150° C. and sintering at a temperature of 450° C., a multi-porous ITO film having a thickness of about 0.1 $\mu$m is completed.

Next, as a second process, the patterning of the ITO film is performed. A positive type photoresist is coated to a thickness of about 1 $\mu$m on the ITO film by the spin-coating method, thereafter subjected to pre-baking at a temperature of 80° C. and thereafter exposed to ultraviolet rays via a photomask. Subsequently, by performing a developing process and a post-baking process at a temperature of 120° C., a resist pattern having an interconnection shape is formed on the ITO film. By immersing the glass substrate on which this resist pattern is formed in HBr, the ITO film is etched within the region that is not covered with the resist. Finally, by removing the resist by means of a resist removing liquid, an ITO pattern of the interconnection shape is formed.

Further, as a third process, an Ni film is formed on the ITO film by electroless plating. First, the insulating substrate provided with an ITO pattern is subjected to degreasing and cleaning by means of alkali and an organic solvent. Next, by slightly roughening the ITO film surface by etching with a fluoride-containing solution as the occasion demands and thereafter performing an activating treatment by immersion in a palladium chloride solution, a palladium catalyst that becomes the catalyst for electroless plating is deposited on only the ITO film. Then, the Ni film is formed to a thickness of about 0.3 μm by means of an electroless Ni plating liquid using hypophosphite as a reductant. Through this process, the Ni film is selectively formed on only the ITO pattern.

As a method for providing a palladium catalyst, it is also allowed to deposit a palladium catalyst selectively on only the ITO film through a catalyst providing process with a complex salt made of $PdCl_2$ or $SnCl_2$ or a colloid solution and a catalyst accelerating process with acid accelerator containing fluoride.

By incorporating a catalyst of Pd or the like into the oxide film obtained by the sol-gel method or forming an oxide film made principally of PdO, the aforementioned catalyst providing process can also be eliminated.

Figure 5A:
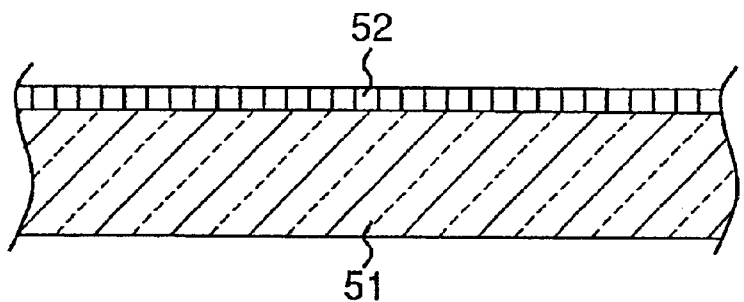
FIGS. 5A through 5C are sectional views of oxide film structures varied depending on the film forming method.
Figure 5B:
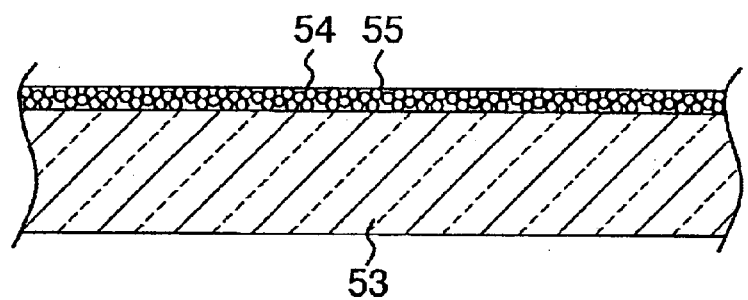

In general, the oxide film obtained by the sol-gel method can be formed as a fine film having a small number of holes. However, by controlling the composition of the sol-gel solution and the sintering condition, a multi-porous film in which minute holes exist in a network shape can also be obtained. That is, by comparison with the smooth surface shape of an ITO film 52 formed on a glass substrate 51 by the sputtering method as shown in FIG. 5A, an ITO film 54 that is formed on an insulating substrate 53 by the sol-gel method and internally has many holes 55 can be obtained as shown in FIG. 5B. As described above, in the case of the ITO film 54 that is intentionally formed multi-porous, the palladium catalyst for electroless plating is also deposited inside the minute holes of the ITO film 54, and Ni is deposited so as to fill up the holes. Therefore, the minute holes of the ITO film 54 produce an anchor effect, and a plating film having a good adhesion property can be obtained by comparison with the Ni plating on the ITO film 54 obtained through vacuum film formation such as sputtering.

For the sake of comparison, the ITO film formed by the sputtering method and the ITO film formed by the sol-gel method were subjected to electroless plating with Ni under same conditions without performing the surface roughening process by etching of the ITO film and to the evaluation of the adhesion property through a peeling test by a cross-cutting method. As a result, Ni plated on the ITO film formed by the sputtering method exhibited a partial exfoliation phenomenon, whereas Ni plated on the ITO film formed by the sol-gel method exhibited no film exfoliation.

The thus obtained electroless Ni plating film becomes an eutectoid film of Ni and P under the influence of the reductant. Therefore, the film has a high surface resistance of 4 to 5 ohms/square and is able to be limitedly used for the electric interconnections. Therefore, in order to reduce the resistance of the Ni film, the Ni film is plated with Au as the occasion demands.

This Au plating is able to perform electroless plating on the Ni film, and therefore, a film can be selectively formed on only the Ni/ITO film having an interconnection shape. By replacing the Ni film with Au to a depth of about 0.5 μm from the surface, the surface resistance of the film can be reduced to a resistance of about 0.5 ohms/square.

Further, if resistance reduction is required, then it is proper to increase the film thickness of Au by electroplating or form a low-resistance film of Cu or the like on the Au film by metal electrolysis (or electroless plating). It is to be noted that the increase in thickness of Au plating leads to a cost increase, and therefore, it is preferable to reduce the resistance by Cu plating. For example, if a Cu film is formed to a thickness of about 0.15 μm on an Au/Ni/ITO film by Cu electroplating, then the surface resistance of the film is reduced to about 0.1 ohms/square, and the film can be sufficiently used for the electric interconnections of a large-size high-definition flat panel display.

In this case, the electric interconnections come to have a structure in which Cu is exposed on the surface. However, in order to prevent the oxidation of Cu, it is of course useful to protect Cu until the next process by further laminating a barrier metal or coating an oxygen interrupting film.

The plating film to be formed on the ITO film is not limited to the above, and it is also acceptable to use a variety of metals of nickel, cobalt, tin, gold, copper, silver or palladium or a combination of these substances for the film.

Electric Interconnection Fabricating Method (2)

Similarly to the first and second processes of the fabricating method (1), an ITO film is formed by the sol-gel method and the ITO film is patterned by etching. By controlling the composition of the sol-gel solution and the sintering conditions when forming an oxide film, a multi-porous film in which minute holes exist in a network shape inside the oxide film is formed.

Subsequently, as a third process, a metal film is formed on the ITO film. Specifically, a palladium catalyst is deposited selectively on only the ITO film through a catalyst providing process with a complex salt made of $PdCl_2$ or $SnCl_2$ or a colloid solution and a catalyst accelerating process with an acid accelerator containing fluoride. In this stage, a palladium catalyst is deposited inside the minute holes of the ITO film.

Subsequently, a Cu film is formed to a thickness of 0.2 μm on the ITO film by electroless plating. Conventionally, the electroless plating of the ITO film with Cu has had a very bad adhesion property and the formation of a Cu film has been difficult. However, according to this fabricating method (2), the minute holes of the ITO film formed by the sol-gel method produce an anchor effect, and this allows direct Cu plating on the ITO film to be achieved. By utilizing this theory, the ITO film can be directly plated with not only Cu but also another metal such as Au.

With this arrangement, the surface resistance of the Cu/ITO film becomes about 0.1 ohms/square, and the film can be sufficiently used for the electric interconnections of a large-size high-definition flat panel display.

First, as a first process, an $SnO_2$ film is formed by the sol-gel method on a glass substrate of #1737 produced by Corning Corp. In this stage, a sol-gel solution is blended with acetylacetone (AcAc), diluted with alcohol to an appropriate viscosity and coated to a thickness of about 0.1 μm by the spin-coating method. Then, the resulting object is dried at a temperature of about 200° C. so as to form an $SnO_2$ chelate film.

Next, as a second process, the $SnO_2$ chelate film is patterned. Specifically, by applying ultraviolet rays (λ=300 nm) to the $SnO_2$ chelate film via a photomask on which an interconnection pattern is drawn, the chelate bond of only the portion to which the ultraviolet rays are applied is cut. Subsequently, if the insulating substrate is immersed in an alkaline solution, then only the chelate film that has not been exposed to ultraviolet rays is dissolved, and the $SnO_2$ pattern is consequently completed. Subsequently, by performing sintering at a temperature of about 400° C., the $SnO_2$ is made to be fine and have a low resistance, completing the $SnO_2$ interconnection pattern.

Next, as a third process, a metal film is formed on the $SnO_2$ film by plating. As a plating film forming method, a method similar to those of the aforementioned fabricating methods (1) and (2) can be used with the following structure of:

Ni/SnO$_2$ film,

Au/Ni/SnO$_2$ film,

Cu/Au/Ni/SnO$_2$ film,

Cu/Ni/SnO$_2$ film, or

Cu/SnO$_2$ film.

Particularly, by employing a film construction using Cu or Au, the surface resistance of the film becomes about 0.1 Ω/□, and the film can be sufficiently used for the electric interconnections of a large-size high-definition flat panel display.

The aforementioned electric interconnection fabricating method (3), which requires neither resist coating process nor resist removing process between the film formation of the SnO$_2$ film and the patterning, has an improved fabrication efficiency as compared with the fabricating method (1).

As a sol-gel oxide film that can provide photosensitivity using a chelating agent, there can be formed a variety of oxide films made of In$_2$O$_3$, ITO, TiO$_2$, ZrO$_2$ and SiO$_2$ besides the aforementioned SnO$_2$ film. By making a catalyst selectively adhere to the surface of the oxide film, a variety of metal films can be selectively formed by plating on the oxide film pattern.

Electric Interconnection Fabricating Method (4)

First, as a first process, a ZnO film is formed by the chemical deposition method on a glass substrate of #1737 produced by Corning Corp. Describing in concrete this process, the ZnO film is formed to a thickness of 0.2 μm by first degreasing and cleaning a glass substrate with an alkaline solution and an organic solvent, providing a palladium catalyst through a process with a sensitizer and an activator and thereafter immersing the resulting substrate in an aqueous solution containing Zn(NO$_3$)$_3$ and dimethylamine borane (DMAB) at a bath temperature of 60° C. (refer to the prior art reference of Japanese Patent Laid-Open Publication No. HEI 9-278437 for the detail of the film forming process).

Figure 5C:
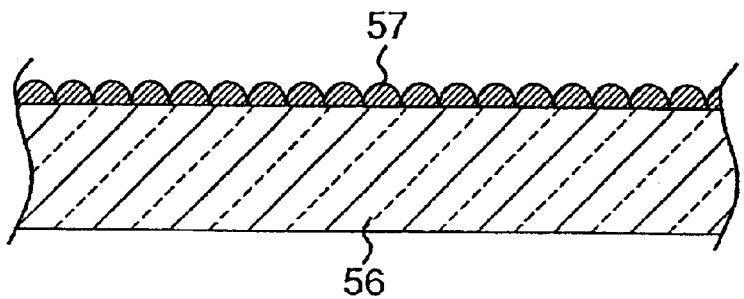

In this case, the film is formed around a core of palladium, or the catalyst. Therefore, a significant unevenness exists on the surface by comparison with the oxide film formed by a vacuum film forming apparatus. That is, as shown in FIG. 5C, there can be obtained a ZnO film 57 that is formed on the insulating substrate 56 by the chemical deposition method and has surface unevenness.

Next, as a second process, the ZnO film is patterned according to an interconnection shape through an etching process using a resist mask.

Next, as a third process, a metal film is formed on the ZnO film by plating. As a plating film forming method, a method similar to those of the aforementioned fabricating methods (1) and (2) can be used with the following structure of:

Ni/ZnO film,

Au/Ni/ZnO film,

Cu/Au/Ni/ZnO film,

Cu/Ni/ZnO film, or

Cu/ZnO film.

Particularly, by employing a film construction using Cu or Au, the surface resistance of the film becomes about 0.1 Ω/□, and the film can be sufficiently used for the electric interconnections of a large-size high-definition flat panel display.

A similar plating film can be obtained by employing an ITO film obtained by the chemical deposition method in place of the ZnO film.

The surface unevenness of the oxide film obtained by the chemical deposition method as in the case of the aforementioned ZnO film and ITO film produces an anchor effect, allowing a plating film having a very good adhesion property can be obtained.

For the sake of comparison, the ITO film formed by the sputtering method and the ZnO film formed by the chemical deposition method were both subjected to electroless plating with Ni under same conditions without performing the surface roughening process by etching of the ITO film and to the evaluation of the adhesion property through a peeling test by the cross-cutting method. As a result, Ni plated on the ITO film formed by the sputtering method exhibited a partial exfoliation phenomenon, whereas Ni plated on the ZnO film formed by the chemical deposition method exhibited no film exfoliation.

As a method for forming an oxide film in an aqueous solution, there is a liquid phase deposition method using the hydrolytic equilibrium reaction of a metallic fluoro complex or hydrosilicofluoric acid besides the chemical deposition method using the aforementioned redox reaction, and the formation of a variety of oxide films made of SiO$_2$ or TiO$_2$ can be achieved.

By making the catalyst selectively adhere to the surface of these oxide films, a variety of metal films can be selectively formed by plating on the oxide film pattern.

The oxide film is deposited in an aqueous solution according to the aforementioned electric interconnection fabricating method (4), and therefore, film formation can also be achieved at a low temperature of not higher than 100° C. The metal film to be formed by plating on the oxide film can also be formed at a low temperature of not higher than 100° C., and therefore, electric interconnections can be entirely formed through the low temperature process of not higher than 100° C. except for auxiliary sintering after the film formation in order to improve the adhesion property. Therefore, the substrate is not limited to the glass substrate, and electric interconnections can be easily formed on an organic substrate (or film) of ABS, PC, PET or the like.

The electric interconnection fabricating methods (1) through (4), which do not use any vacuum film forming apparatus, can obtain a sufficient cost reduction effect by comparison with the conventional electric interconnection fabricating method. The wet type film forming technique, which can form a large-area film easier than the vacuum film forming technique, can easily cope with a large-area substrate. Furthermore, electric interconnections can be formed with high productivity according to a roll-to-roll system while continuously transferring a very long film material wound in a roll form taking advantage of the merit of using no vacuum system.

According to the first embodiment of the present invention, the electric interconnections are formed by forming the metal film by electroless plating on the oxide film obtained entirely by the wet type film forming technique. However, if a conductive oxide film is used as the oxide film, then a plating film can be formed directly on the conductive oxide film also by electroplating instead of electroless plating. It is to be noted that the distribution in film thickness of the plating film is influenced by the sheet resistance of the conductive oxide film in this case, and therefore, the substrate size and applications are limited taking the above factor into consideration.

According to the first embodiment, a metal film of an excellent adhesion property can be formed by providing a metal plating on the oxide film formed by the sol-gel method and the chemical deposition method rather than by providing a metal plating on the oxide film formed by the sputtering method and the deposition method using a vacuum film forming apparatus. Therefore, a display device having excellent reliability can be provided.

Second Embodiment

Figure 6:
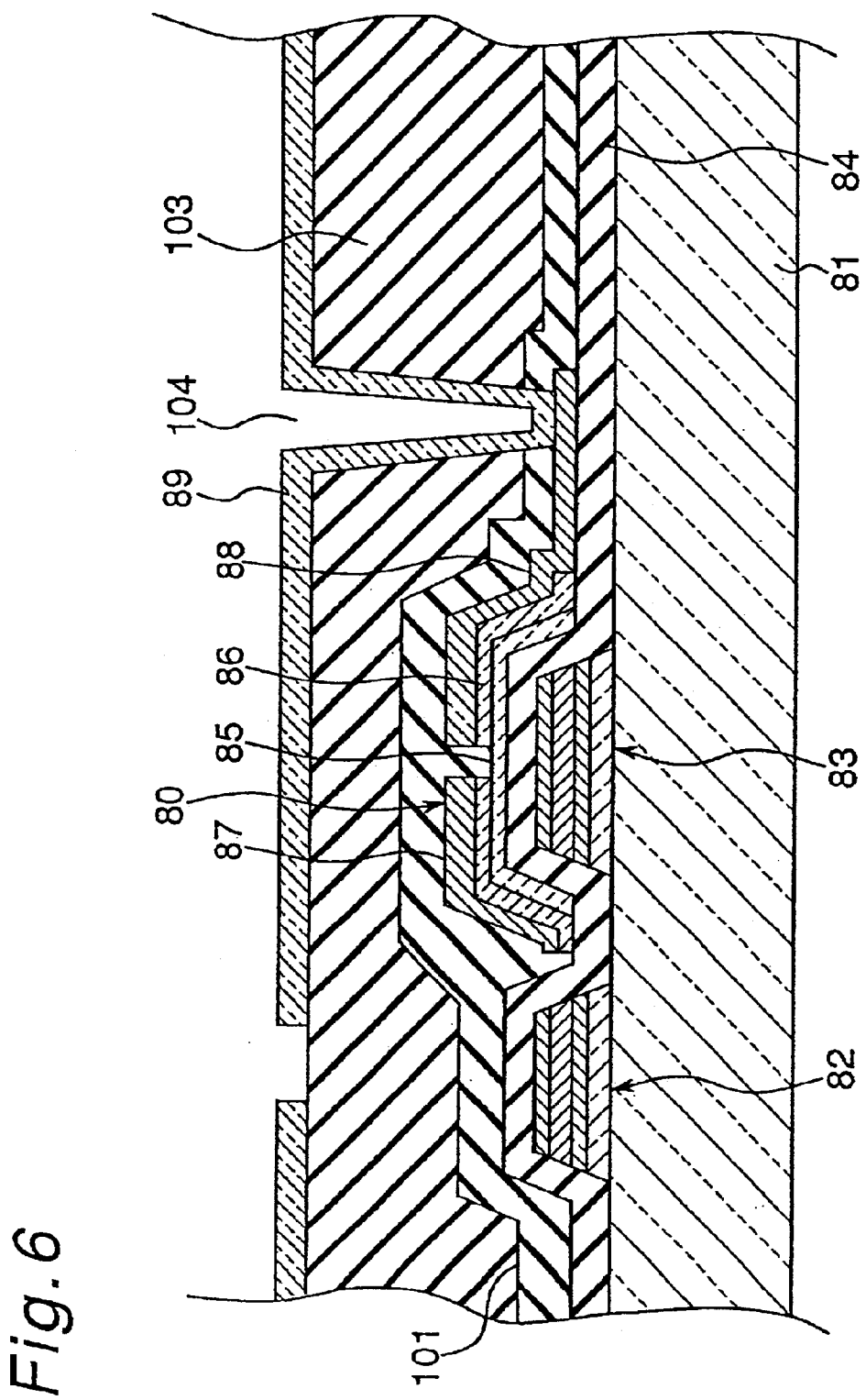
FIG. 6 is a sectional view of an interconnection substrate to be used for a display device according to a second embodiment of the present invention.

FIG. 6 is a sectional view of an interconnection substrate to be used for the display device of the second embodiment of the present invention. This interconnection substrate is an active matrix substrate for a liquid crystal display device that employs the electric interconnections fabricated by any one of the electric interconnection fabricating methods (1) through (4) of the first embodiment.

As shown in FIG. 6, a gate interconnection 82 (gate electrode 83) is formed on a glass substrate 81, and the electric interconnection fabricating methods (1) through (4) can be simply adopted in place of the conventional electric interconnections of Al, Ta or Mo formed by the sputtering method (FIG. 6 shows only the electric interconnection constructed of a laminate film having a four-layer structure). A gate insulating film 84 made of SiNx is further formed on the interconnection. A TFT portion 80 constructed of a channel layer 85 made of a-Si:H, a contact layer 86 made of n$^+$-type a-Si:H, a source electrode 87 made of Mo and a drain electrode 88 is formed on the gate electrode 83. An insulating protective film 101 made of SiNx and an organic interlayer insulating film 103 are further formed on the TFT portion 80 and the bus line portion (the gate interconnection 82 and a source interconnection (not shown)). A transparent electrode 89 (or a reflecting electrode) is further formed as a pixel electrode in the uppermost layer of the organic interlayer insulating film 103. The transparent electrode 89 that is the pixel electrode and the drain electrode 88 are electrically connected to each other via a contact hole 104 provided between the insulating protective film 101 and the organic interlayer insulating film 103.

The interconnection substrate having the aforementioned construction has an effect similar to that of the interconnection substrate of the first embodiment shown in FIG. 1.

Third Embodiment

Figure 7:
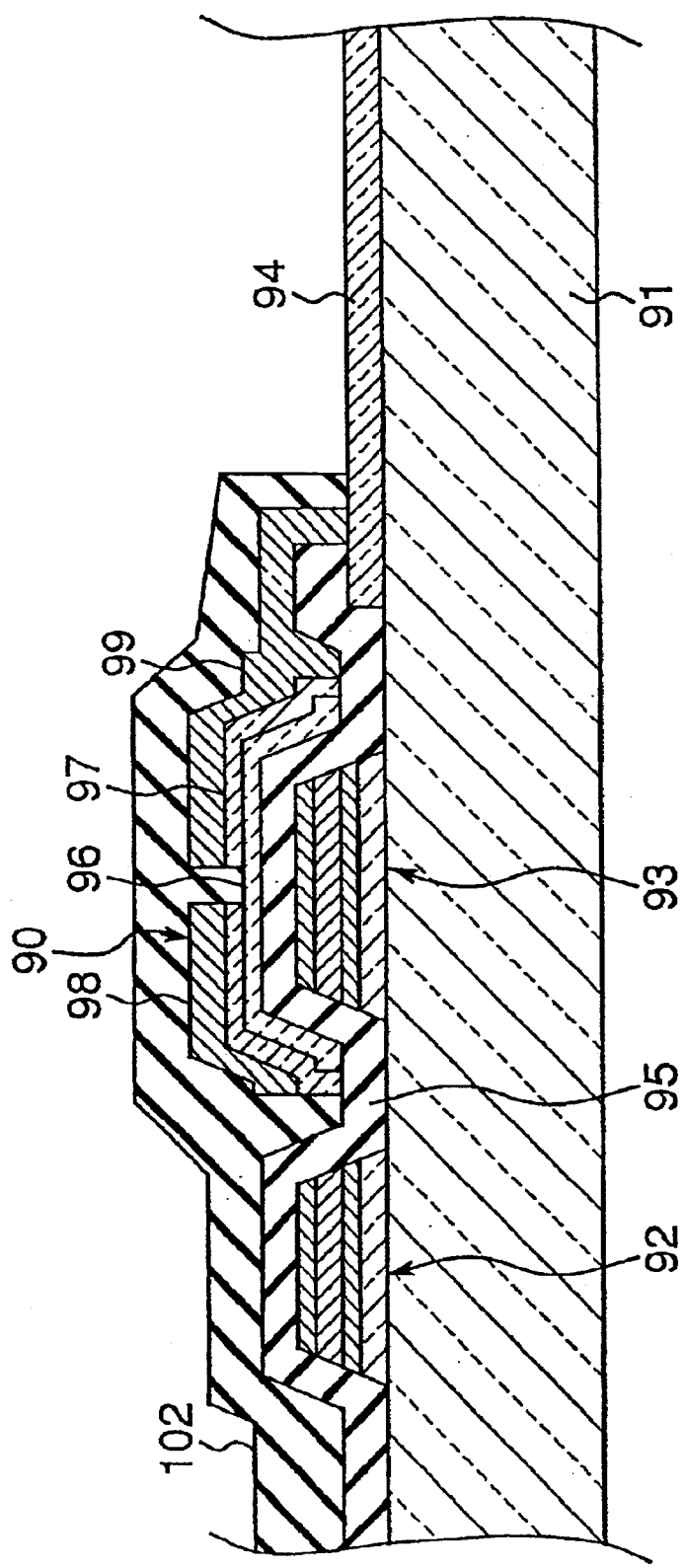
FIG. 7 is a sectional view of an interconnection substrate to be used for a display device according to a third embodiment of the present invention.

FIG. 7 is a sectional view of an interconnection substrate to be used for the display device of the third embodiment of the present invention. This interconnection substrate is an active matrix substrate for a liquid crystal display device that employs the electric interconnections fabricated by any one of the fabricating methods (1) through (4) of the first embodiment.

As shown in FIG. 7, a gate interconnection 92 (gate electrode 93) is formed on a glass substrate 91, and the electric interconnection fabricating methods (1) through (4) are adopted in place of the conventional electric interconnections of Al, Ta or Mo formed by the sputtering method (FIG. 7 shows only the electric interconnection constructed of a laminate film having a four-layer structure). In this case, an oxide film that serves as the lowermost layer of the gate interconnection 92 has preparatorily been formed of a conductive oxide film made of ITO, SnO$_2$ or ZnO and a pixel electrode 94 has preparatorily been formed concurrently with the formation of this conductive oxide film. A gate insulating film 100 made of SiNx is further formed on the interconnection. A TFT portion 90 constructed of a channel layer 96 made of a-Si:H, a contact layer 97 made of n$^+$-type a-Si:H, a source electrode 98 made of a metal of Mo, Ta or Al and a drain electrode 99 is formed on the gate electrode 93. An insulating protective film 102 made of SiNx or an organic interlayer insulating film is formed on the TFT portion 90 and the bus line portion (the gate interconnection 92 and a source interconnection (not shown)).

If the conductive oxide film made of ITO, SnO$_2$, ZnO or the like having excellent transparency is employed as the oxide film located in the lowermost layer of the gate interconnection 92, then the electric interconnections and the separately provided transparent conductive film (for example, the transparent electrode provided for each pixel), which are both required to be formed as in the case of a liquid crystal display device, can be formed of an identical transparent conductive oxide film, allowing the reduction in number of processes (for higher efficiency) to be achieved.

Fourth Embodiment

Figure 8:
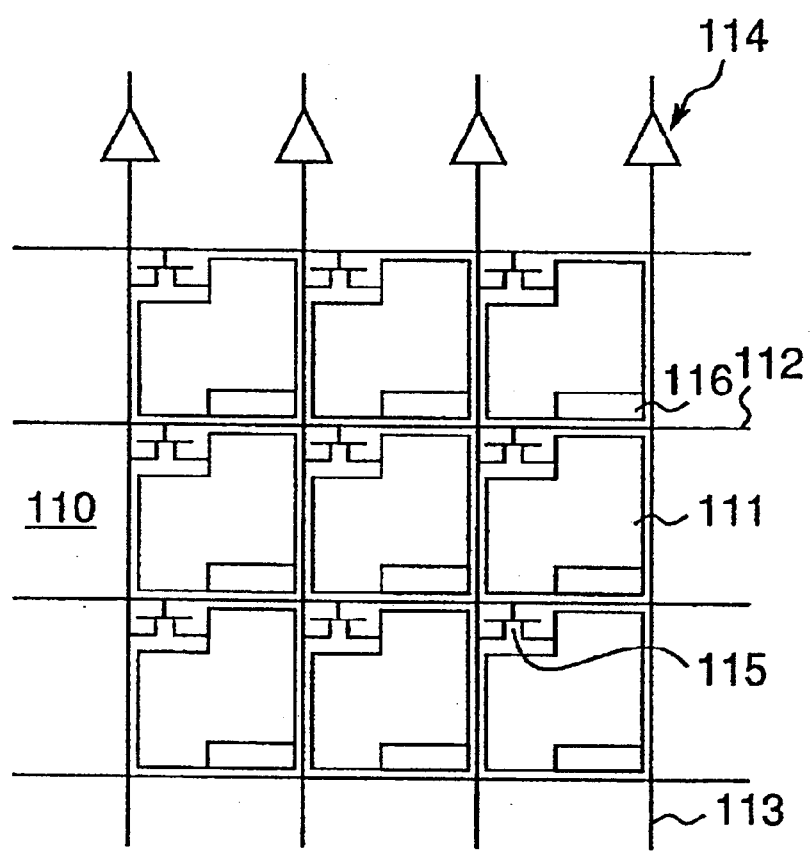
FIG. 8 is a schematic plan view of a two-dimensional image detector according to a fourth embodiment of the present invention.

FIG. 8 shows a schematic plan view of the two-dimensional image detector of the fourth embodiment of the present invention. As shown in FIG. 8, the two-dimensional image detector is provided with a glass substrate 110, pixel electrodes 111 arranged in a matrix form on the glass substrate 110, a gate interconnection 112 provided for each row of the pixel electrodes 111, a data electrode 113 provided for each column of the pixel electrodes 111, an amplifier 114 whose input terminal is connected to the data electrode 113, a TFT 115 whose gate is connected to the gate interconnection 112 and a storage capacitor 116 provided for each pixel electrode 111.

Figure 9:
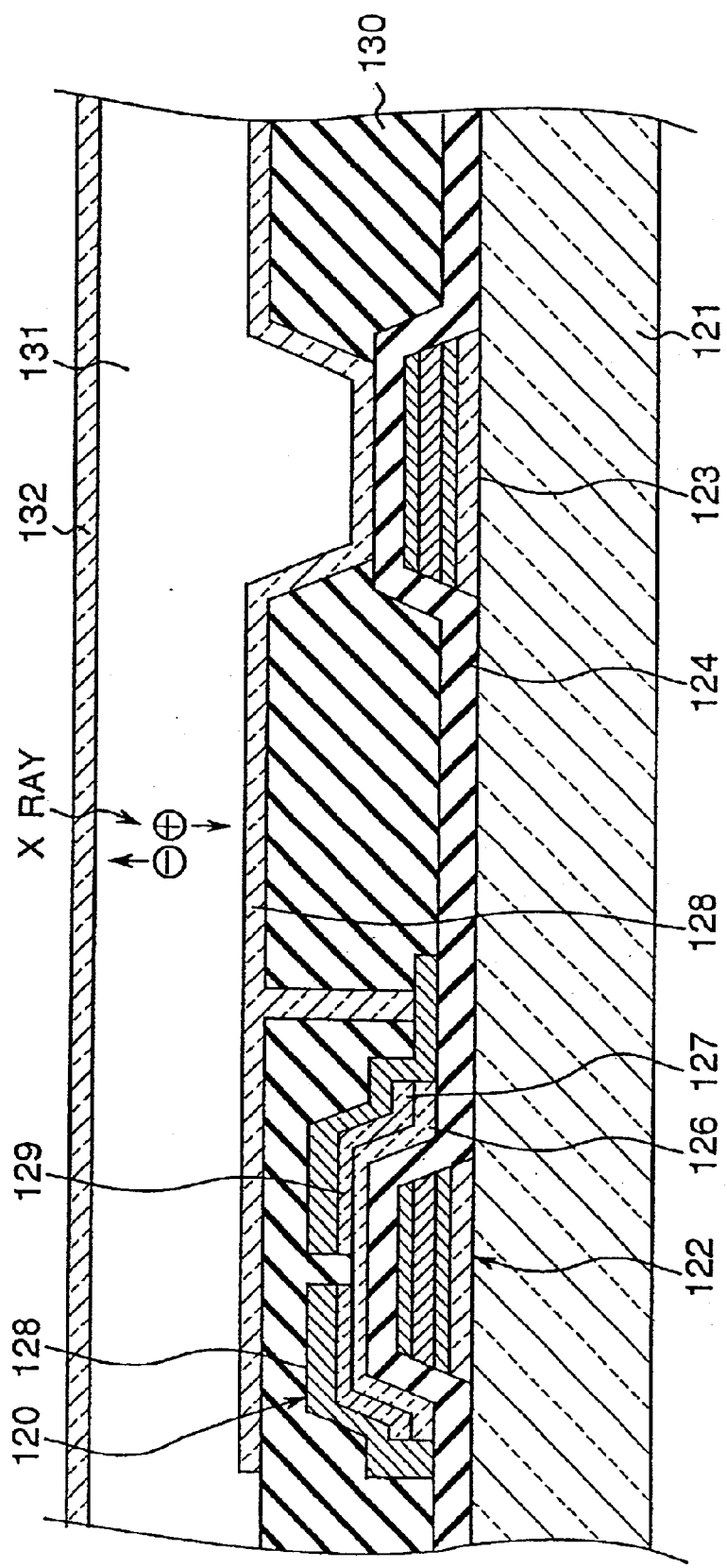
FIG. 9 is a sectional view of one pixel of the above two-dimensional image detector.

FIG. 9 is a sectional view of one pixel of the two-dimensional image detector shown in FIG. 8. This two-dimensional image detector basically has a structure in which an X-ray conductor and an upper electrode are formed on an active matrix board. As shown in FIG. 9, a gate electrode 122 is formed on a glass substrate 121. This gate electrode 122 is constructed of a laminate film of Cu/Au/Ni/ITO formed entirely by the wet type film forming technique described in connection with the first embodiment, dissimilar to the conventional electric interconnections of Al, Ta or Mo formed by the sputtering method. A gate insulating film 124 made of SiNx is further formed on the interconnections. A TFT portion 120 constructed of a channel layer 126 made of a-Si:H, a contact layer 127 made of n$^+$-type a-Si:H, a source electrode 128 made of a metal of Al, Ta, Mo or the like and a drain electrode 129 is formed on the gate electrode 122. An insulating layer 130 made of a resin is further formed so as to cover the TFT portion 120, the gate interconnection and a source interconnection (not shown), and thereafter, a transparent electrode and a metal electrode are formed as a pixel electrode 128. The pixel electrode 128 and the drain electrode 129 of the TFT portion 120 are connected to each other by way of a via hole (not shown) provided through the insulating layer. The storage capacitor is comprised of the gate insulating film 124 interposed between a storage capacitor electrode 123 and the pixel electrode 128.

By forming an X-ray conductive layer 131 and an upper electrode 132 on the active matrix substrate having the aforementioned construction, a two-dimensional image detector is completed. It is to be noted that a-Se, CdTe, CdZnTe, PbI$_2$ or the like can be used as the material of the X-ray conductive layer 131.

If X-rays are incident on the X-ray conductive layer in the two-dimensional image detector having the aforementioned construction, then an electron-hole pair is generated inside the X-ray conductive layer 81, and the electric charges are accumulated in the storage capacitor (constructed of the storage capacitor electrode 123, the pixel electrode 128 and the gate insulating film 124). By successively reading the electric charges by the TFT portion 120 (115 in FIG. 8) arranged in the two-dimensional shape, an X-ray image can be obtained.

As described above, electric interconnections (gate interconnections) of a laminate structure formed of a metal film and an oxide film can be obtained in the aforementioned two-dimensional image detector without using any vacuum film forming apparatus. Therefore, a metal film having an excellent adhesion property can be formed on the oxide film similarly to the first through third embodiments. Therefore, a two-dimensional image detector of high reliability can be provided.

According to this fourth embodiment, no vacuum film forming apparatus is used. Therefore, the apparatus cost is low, and a sufficient cost reduction effect by comparison with the conventional electric interconnection fabricating method can be obtained. The wet type film forming technique, which can form a large-area film more easily than the vacuum film forming technique, can easily cope with a large-area substrate. In particular, if it is tried to detect a two-dimensional image of X-rays, then a two-dimensional image detector of a size roughly equal to that of the image receiving area is necessary since it is theoretically difficult to form an X-ray image. Accordingly, it is required to increase the area of the two-dimensional image detector itself, and therefore, the present invention can be evaluated as very effective. Furthermore, low-temperature film formation can be achieved, and therefore, the quantity of energy consumption relevant to the film formation can also be reduced.

Furthermore, the X-ray conductive layer may be patterned so as to be separated every pixel, and the X-ray conductive layer is also made able to have a variety of diode structures. If a photoconductive layer is used in place of the X-ray conductive layer, then a two-dimensional image detector sensitive to visible light can be formed. Furthermore, it is able to construct a two-dimensional image detector sensitive to X-rays can be constructed by combining the two-dimensional image detector sensitive to visible light and an X-ray-to-light converting layer.

It is to be noted that the structures of the interconnection substrates (active matrix substrates) shown in FIG. 1, FIG. 6, FIG. 7 or FIG. 9 of the first through fourth embodiments are mere examples, and a wet type film forming technique can be used for not only the gate interconnection but also the source interconnection. The TFT structure is limited to neither one of the TFT portions 15, 80, 90 and 120 shown in FIG. 1, FIG. 6, FIG. 7 and FIG. 9, and the structure can be applied to either one of a stagger structure or a reverse stagger structure. It is acceptable to adopt not only the TFT employing a-Si but also a TFT structure employing another semiconductor film made of p-Si, CdSe or the like. Further, an active matrix substrate employing Metal Insulator Metal (MIM), back-to-back diode (BTB), a diode ring, a varistor, a plasma switching or the like may be broadly used for a display device or an image detector besides TFT. The structure of the electric interconnections can also be used for an interconnection substrate provided with no active element, and a passive matrix type display device can be formed by employing the interconnection substrate.

The liquid crystal display device employing the interconnection substrate has been described in connection with the first through third embodiments. However, the display device is not limited to this, and the present invention can be applied to display devices employing an optical medium other than liquid crystal as a display medium and to, for example, display devices that need electric interconnections, such as:

plasma display devices (PDP), inorganic or organic EL display devices, electrochromic display devices, and electrophoretic display devices.

The present invention can be widely applied, among others, to display devices that require resistance reduction, areal increase and cost reduction.

The electric interconnection fabricating method of the present invention can be widely applied to flat panel display devices of an active matrix drive type and a passive matrix drive type, two-dimensional image detectors having a flat panel shape and other electric equipment provided with electric interconnections.

The interconnection substrate (active matrix substrate) of the present invention can be used for transparent type liquid crystal display devices, reflecting type liquid crystal display devices and two-dimensional image detectors. Among others, the interconnection substrate is very effective for the case of Cu used to reduce the resistance of the electric interconnections or the case of formation of electric interconnections by the wet type film formation instead of the dry type film formation, as in the field of display devices required to have a large area.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. An electric interconnection fabricating method comprising:

an oxide film forming process for forming an oxide film on an insulating substrate by a first wet type film forming technique; and a metal film forming process for forming a metal film on the oxide film by a second wet type film forming technique, wherein the first wet type film forming technique used for the oxide film forming process is a sol-gel method.

2. The electric interconnection fabricating method as set forth in claim 1, further comprising:

a patterning process for patterning the oxide film according to a specified shape between the oxide film forming process and the metal film forming process.

3. The electric interconnection fabricating method as set forth in claim 2, wherein a precursor of the oxide film has photosensitivity and the patterning process for patterning the oxide film according to the specified shape comprises a process for applying light to the precursor of the oxide film.

4. The electric interconnection fabricating method as set forth in claim 1, wherein the second wet type film forming technique used for the metal film forming process is a wet type plating method.

5. The electric interconnection fabricating method as set forth in claim 1, wherein the oxide film contains a plating catalyst.

6. The electric interconnection fabricating method as set forth in claim 1, wherein the oxide film is a conductive oxide film.

7. The electric interconnection fabricating method as set forth in claim 1, wherein the conductive oxide film has transparency.

8. The electric interconnection fabricating method as set forth in claim 1, wherein the conductive oxide film is a film to be used for the electric interconnections and an application other than the electric interconnections and is formed of an identical material on the insulating substrate through an identical process.

9. The electric interconnection fabricating method as set forth in claim 1, wherein
the metal film is either a single layer film made of any one of nickel (Ni), copper (Cu) and gold (Au) or a multi-layer film including at least one of the single layer films.

10. An electric interconnection fabricating method comprising:
a catalyst providing process for providing a catalyst on an insulating substrate;
an oxide film forming process for forming an oxide film on the insulating substrate provided with the catalyst by a chemical deposition method in an aqueous solution; and
a metal film forming process for forming a metal film on the oxide film by a wet type plating method.

11. The electric interconnection fabricating method as set forth in claim 10, wherein the oxide film is made of Zinc Oxide (ZnO).

12. The electric interconnection fabricating method as set forth in claim 10, wherein the metal film has one or more layers, at least one of which is made from a material selected from the group consisting on nickel (Ni), copper (Cu) and gold (Au).

13. An electric interconnection fabricating method comprising:
an oxide film forming process for forming an oxide film on an insulating substrate by a first wet type film forming technique; and
a metal film forming process for farming a metal film on the oxide film by a second wet type film forming technique,
wherein the first wet type film forming technique used for the oxide film forming process is either a chemical deposition or a liquid phase deposition method.

14. The electric interconnection fabricating method as set forth in claim 13, further comprising:
a patterning process for patterning the oxide film according to a specified shape between the oxide film forming process and the metal film forming process.

15. The electric interconnection fabricating method as set forth in claim 14, wherein
a precursor of the oxide film has photosensitivity and the patterning process for patterning the oxide film according to the specified shape comprises a process for applying light to the precursor of the oxide film.

16. The electric interconnection fabricating method as set forth in claim 13, wherein
the second wet type film forming technique used for the metal film forming process is a wet type plating method.

17. The electric interconnection fabricating method as set forth in claim 13, wherein
the oxide film contains a plating catalyst.

18. The electric interconnection fabricating method as set forth in claim 13, wherein
the oxide film is a conductive oxide film.

19. The electric interconnection fabricating method as set forth in claim 13, wherein
the conductive oxide film has transparency.

20. The electric interconnection fabricating method as set forth in claim 13, wherein
the conductive oxide film is a film to be used for the electric interconnections and an application other than the electric interconnections and is formed of an identical material on the insulating substrate through an identical process.

21. The electric interconnection fabricating method as set forth in claim 13, wherein
the metal film is either a single layer film made of any one of nickel (Ni), copper (Cu) and gold (Au) or a multi-layer film including at least one of the single layer films.

* * * * *